(12) United States Patent
Kawahara (10) Patent No.: US 7,595,861 B2
(45) Date of Patent: Sep. 29, 2009

(54) EXPOSURE APPARATUS AND METHOD OF MANUFACTURING DEVICE

(75) Inventor: Atsushi Kawahara, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/038,980

(22) Filed: Feb. 28, 2008

(65) Prior Publication Data

US 2008/0218708 A1 Sep. 11, 2008

(30) Foreign Application Priority Data

Mar. 6, 2007 (JP) ............................. 2007-056369

(51) Int. Cl.
*G03B 27/42* (2006.01)
*G03B 27/52* (2006.01)
(52) U.S. Cl. ......................................... 355/53; 355/30
(58) Field of Classification Search .................. 355/30, 355/53, 67; 356/237.2, 394, 601
See application file for complete search history.

(56) References Cited

U.S. PATENT DOCUMENTS 5,162,867 A * 11/1992 Kohno ..................... 356/237.5
6,163,369 A 12/2000 Yamada et al. ................. 355/55
6,236,447 B1 5/2001 Yamada et al. ................. 355/53
6,795,166 B2 * 9/2004 Kato et al. ..................... 355/67
2006/0203232 A1 * 9/2006 Okita ....................... 356/237.2

* cited by examiner

*Primary Examiner*—Hung Henry Nguyen
(74) *Attorney, Agent, or Firm*—Fitzpatrick, Cella, Harper & Scinto (57) ABSTRACT

An exposure apparatus for transferring a pattern to a substrate by exposing the substrate to light via a reticle. The exposure apparatus includes an inspection unit to inspect the reticle, an exposure unit to expose the substrate to light via the reticle inspected by the inspection unit, and a controller to control the inspection unit and the exposure unit. The controller (i) sets a partial region of the reticle, (ii) causes the inspection unit to inspect the partial region of the reticle and a region of the reticle that is different from the partial region, and (iii) causes the exposure unit to expose the substrate to light via the partial region, irrespective of a presence and an absence of an abnormality in the region that is different from the partial region, if the inspection unit finds no abnormality in the partial region.

12 Claims, 9 Drawing Sheets

EXPOSURE APPARATUS AND METHOD OF MANUFACTURING DEVICE

This application claims the benefit of Japanese Patent Application No. 2007-056369, filed Mar. 6, 2007, which is hereby incorporated by reference herein in its entirety.

BACKGROUND OF THE INVENTION

1. Field of the Invention

The present invention relates to an exposure apparatus and a method of manufacturing a device using the exposure apparatus.

2. Description of the Related Art

In a process of manufacturing a device, such as an IC or an LSI, a pattern formed on a reticle (which can also be called a photomask or an original) is generally transferred to a substrate, such as a wafer, coated with a photosensitive material (photoresist). An exposure apparatus is used for this transfer. When a foreign particle (foreign substance) adheres on the reticle, or the reticle has a pattern defect, the foreign particle or pattern defect is transferred to the substrate together with the pattern.

To solve this problem, an inspection apparatus inspects the reticle before it is used to expose the substrate to light. The inspection apparatus is built in the exposure apparatus or used as an apparatus outside the exposure apparatus.

In recent years, a method of preparing a reticle having a plurality of pattern regions and transferring only a necessary pattern region to a substrate while shielding regions other than the necessary pattern region from light is often used. A plurality of pattern regions formed on one reticle are used in turn in accordance with, e.g., the progress of a process of manufacturing a semiconductor device. This reticle is often called a multi-layer reticle. In this specification, a reticle having a plurality of pattern regions will be called a multi-pattern reticle, irrespective of whether it is used to manufacture the same device.

Consider a case in which a specific pattern region of a multi-pattern reticle is to be used for the next exposure. In this case, an inspection apparatus inspects all the pattern regions included in a multi-pattern reticle prior to the next exposure. If the multi-pattern reticle is determined to be defective by this inspection and its use is canceled, the throughput lowers. This is because the time taken to inspect pattern regions, other than a pattern region to be used for the next exposure, is wasted.

SUMMARY OF THE INVENTION

The present invention has been made in consideration of the above-described background, and has as its exemplary object to provide an exposure apparatus advantageous in improving the throughput, and a method of manufacturing a device using the exposure apparatus.

According to a first aspect of the present invention, there is provided an exposure apparatus for transferring a pattern to a substrate by exposing the substrate to light via a reticle. The apparatus comprises an inspection unit configured to inspect the reticle, an exposure unit configured to expose the substrate to light via the reticle inspected by the inspection unit, and a controller configured to control the inspection unit and the exposure unit. The controller is configured (i) to set a partial region of the reticle, (ii) to cause the inspection unit to inspect the reticle on which the partial region is set, and (iii) to cause the exposure unit to expose the substrate to light via the partial region if the inspection unit finds no abnormality in the partial region.

According to a second aspect of the present invention, there is provided an exposure apparatus for transferring a pattern to a substrate by exposing the substrate to light via a reticle. The apparatus comprises an inspection unit configured to inspect the reticle, an exposure unit configured to expose the substrate to light via the reticle inspected by the inspection unit, and a controller configured to control the inspection unit and the exposure unit. The controller is configured (i) to set, for the reticle having a plurality of pattern regions to be selectively used for exposing the substrate to light via the reticle, a partial region including one specific pattern region of the plurality of pattern regions, (ii) to cause the inspection unit to inspect the reticle on which the partial region is set, and (iii) to cause the exposure unit to expose the substrate to light via the specific pattern region, if the inspection unit finds no abnormality in the specific pattern region.

According to a third aspect of the present invention, there is provided an exposure apparatus for transferring a pattern to a substrate by exposing the substrate to light via a reticle, the apparatus comprising:

an inspection unit configured to inspect the reticle;

an exposure unit configured to expose the substrate to light via the reticle inspected by the inspection unit; and a controller configured to control the inspection unit and the exposure unit, wherein the controller is configured (i) to set a first partial region and a second partial region of the reticle, (ii) to cause the inspection unit to perform inspection of the reticle on which the first partial region and the second partial region are set, (iii) to cause the exposure unit to perform the exposure of the substrate to light via the first partial region if the inspection unit finds no abnormality in the first partial region, and (iv) to output information concerning the inspection performed by the inspection unit after the exposure, if the inspection unit finds an abnormality in the second partial region.

According to a fourth aspect of the present invention, there is provided an exposure apparatus for transferring a pattern to a substrate by exposing the substrate to light via a reticle, the apparatus comprising:

an inspection unit configured to inspect the reticle;

an exposure unit configured to expose the substrate to light via the reticle inspected by the inspection unit; and a controller configured to control the inspection unit and the exposure unit, wherein the controller is configured (i) to set, for the reticle having a plurality of pattern regions to be selectively used for exposing the substrate to light via the reticle, a first pattern region and a second pattern region of the plurality of pattern regions, (ii) to cause the inspection unit to perform an inspection of the reticle on which the first pattern region and the second pattern region are set, (ii) to cause the exposure unit to perform an exposure of the substrate to light via the first pattern region if the inspection unit finds no abnormality in the first pattern region, and (iii) to output information concerning the inspection performed by the inspection unit after the exposure, if the inspection unit finds an abnormality in the second pattern region.

According to the present invention, it is possible to provide an exposure apparatus advantageous in improving, e.g., the throughput, and a method of manufacturing a device using the exposure apparatus.

Further features of the present invention will become apparent from the following description of exemplary embodiments with reference to the attached drawings.

DESCRIPTION OF THE EMBODIMENTS

Preferred embodiments of the present invention will be described below with reference to the accompanying drawings.

First Embodiment

Figure 1:
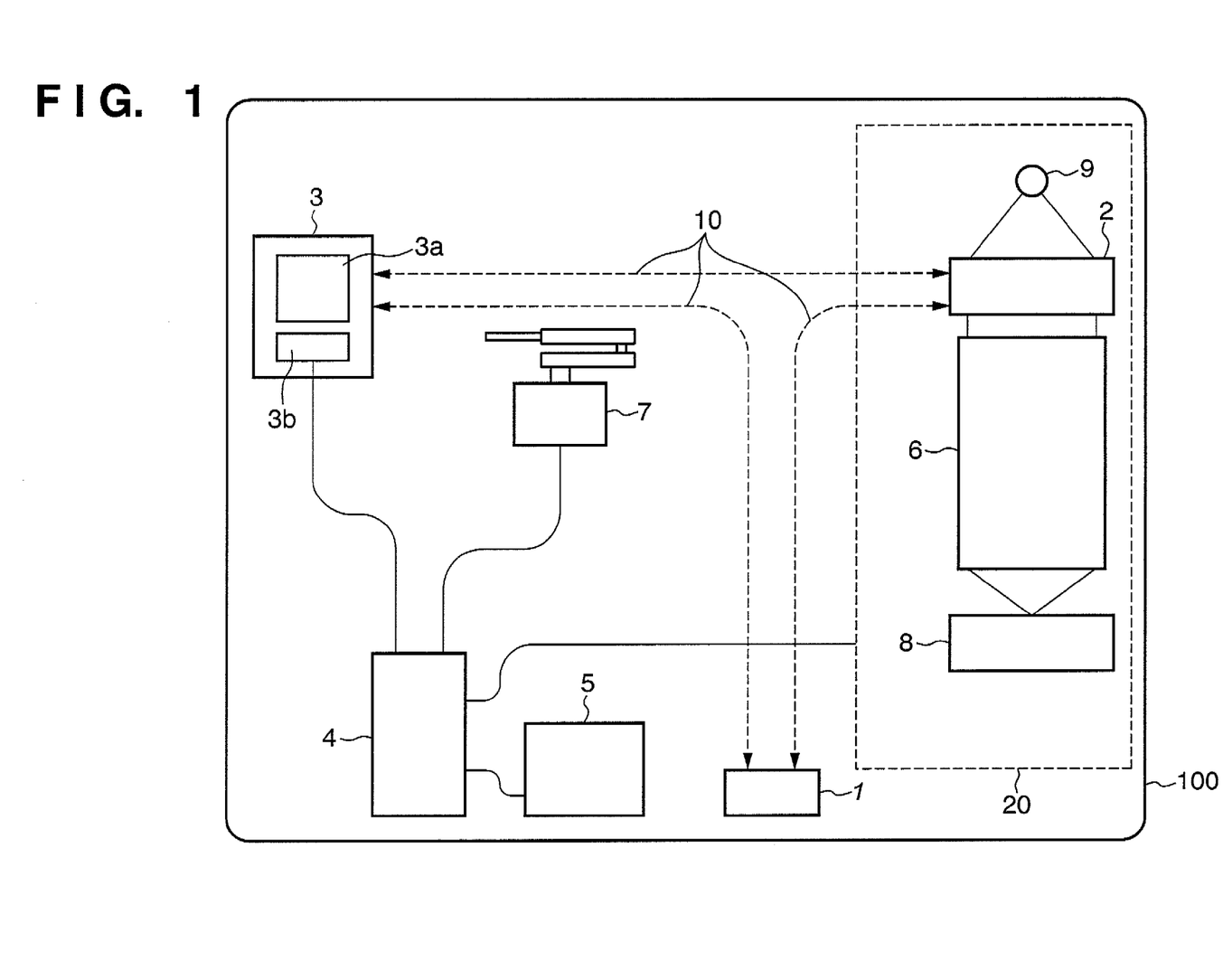
FIG. 1 is a diagram showing the schematic arrangement of an exposure apparatus according to a preferred embodiment of the present invention.

FIG. 1 is a diagram showing the schematic arrangement of an exposure apparatus according to a preferred embodiment of the present invention. An exposure apparatus 100 illustrated in FIG. 1 comprises at least an exposure unit 20 and an inspection apparatus 3.

The exposure unit 20 is configured to transfer the pattern of a reticle to a substrate coated with a photosensitive material. The exposure unit 20 comprises a reticle stage 2 for holding a reticle, a substrate stage 8 for holding a substrate coated with a photosensitive material, a projection optical system 6 for projecting the pattern of the reticle to the substrate, and an illumination system 9 for illuminating the reticle.

The inspection apparatus 3 is configured to inspect a reticle used to transfer its pattern to a substrate in the exposure unit 20. The inspection apparatus 3 can be configured, e.g., to inspect a foreign particle adhering on the reticle and/or to inspect a pattern defect. An example of the reticle is a multi-pattern reticle having a plurality of pattern regions. The multi-pattern reticle is typically a multi-layer reticle. The reticle often has a pellicle to protect it. In this case, the inspection apparatus can be configured to inspect a foreign particle adhering on the pellicle and/or a defect (e.g., a scratch) on the pellicle surface. In this specification, a reticle having or not having a pellicle will be generally referred to as a reticle.

The exposure apparatus 100 can also comprise a reticle holding unit 1 for holding a reticle. A reticle provided from an external apparatus (e.g., a mask stocker) of the exposure apparatus 100 can be placed on the reticle holding unit 1. A reticle provided from the exposure apparatus 100 to the external apparatus can also be placed on the reticle holding unit 1.

The exposure apparatus 100 can also comprise a conveyance robot 7 for moving a reticle into the exposure apparatus 100. The conveyance robot 7 can move the reticle among, e.g., the reticle holding unit 1, the inspection apparatus 3, and the reticle stage 2. A dotted conveyance path 10 schematically shows an example of the path through which the conveyance robot conveys the reticle.

The exposure apparatus 100 can also comprise a controller 4. The control unit 4 controls the constituent elements (e.g., the inspection apparatus 3, the exposure unit 20, and the conveyance robot 7) of the exposure apparatus 100. The controller 4 can connect to a console (user interface unit) 5.

Figure 2:
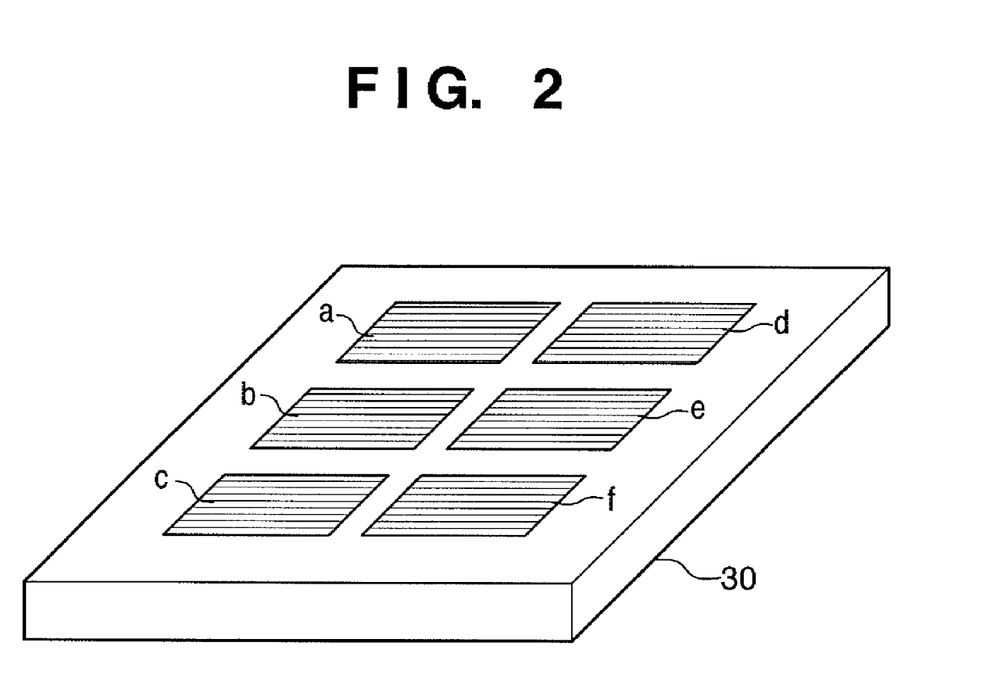
FIG. 2 is a view showing an arrangement of a reticle which can be used for the exposure apparatus.

FIG. 2 is a view showing an arrangement of a reticle 30 which can be used for the exposure apparatus 100. The reticle 30 can be configured as a multi-pattern reticle and, more specifically, as a multi-layer reticle. The reticle 30 includes a plurality of pattern regions a to f. One of the plurality of pattern regions a to f is selectively used in one exposure. A light-shielding member that can be provided to the illumination system 9 or reticle stage 2 shields from light, pattern regions which are not used.

Figure 3:
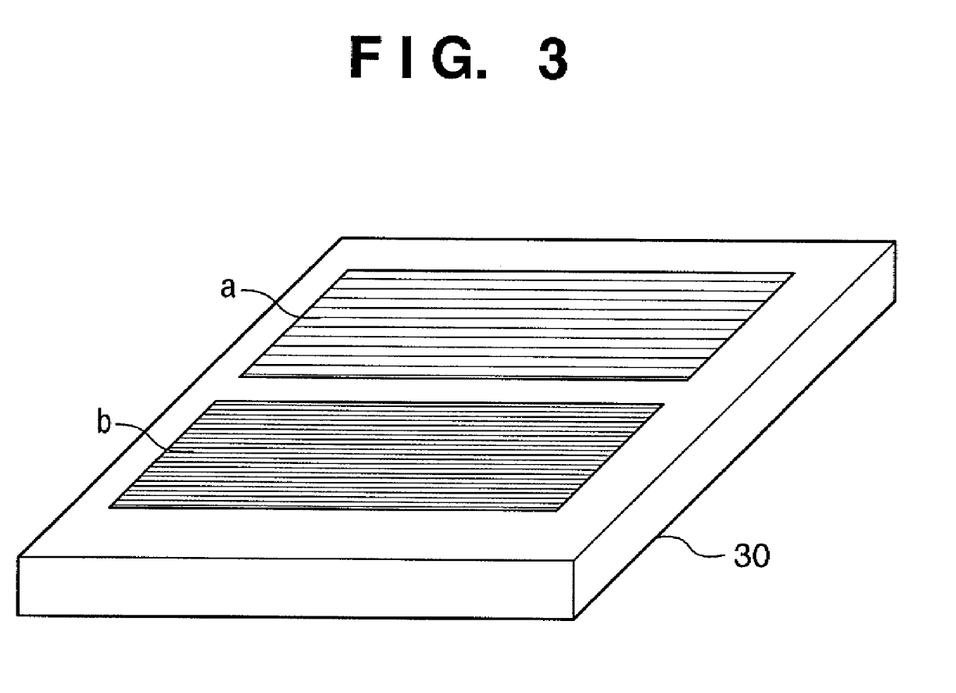
FIG. 3 is a view showing another arrangement of the reticle which can be used for the exposure apparatus.

FIG. 3 is a view showing another arrangement of the reticle 30 which can be used for the exposure apparatus 100. The reticle 30 includes a plurality of pattern regions a to b. One of the plurality of patterns a and b is selectively used in one exposure. A light-shielding member that can be provided to the illumination system 9 or reticle stage 2 shields from light, pattern regions which are not used.

Figure 4:
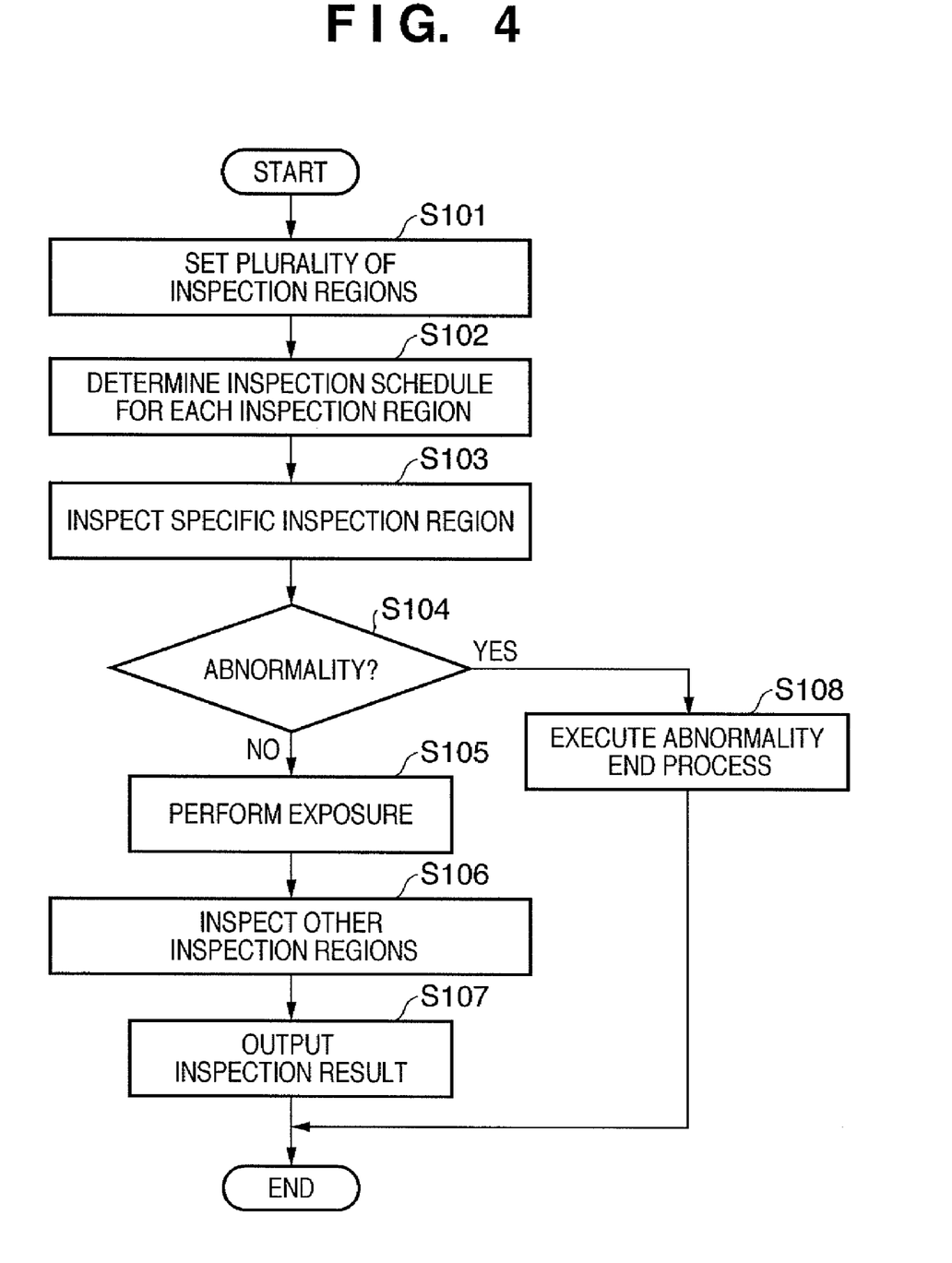
FIG. 4 is a flowchart illustrating the operation of the exposure apparatus shown in FIG. 1, according to the first embodiment.

FIG. 4 is a flowchart illustrating the operation of the exposure apparatus shown in FIG. 1. The controller 4, for example, can control the operation specified by the flowchart illustrated in FIG. 4. The controller 4 sets a plurality of inspection regions for a reticle and controls the inspection apparatus 3 to inspect at least a specific inspection region of the plurality of inspection regions. If the inspection apparatus 3 finds no abnormality in this inspection, the controller 4 allows the exposure unit 20 to perform exposure using the reticle, irrespective of the presence/absence of an abnormality in inspection regions other than the specific inspection region of the plurality of inspection regions.

In step S101, the controller 4 sets a plurality of inspection regions for a reticle 30. Each inspection region is set such that it includes at least one pattern region. The plurality of inspection regions can be set in accordance with, e.g., an instruction issued from the user via the console 5 or an instruction issued from an external apparatus (not shown) via a network or a communication line.

In step S102, the controller 4 sets an inspection schedule for each inspection region. The inspection schedule can be set in accordance with, e.g., an instruction issued from the user via the console 5 or an instruction issued from the external apparatus (not shown) via the network or communication line. The inspection schedule can be determined by, e.g., selecting whether to execute an inspection before an exposure process (step S105) given the first priority, or to be performed next or to execute an inspection after this process. One inspection region is determined as an inspection region to be inspected before an exposure process given the first priority or to be performed next. The inspection region determined to be inspected before the exposure process given the first priority or to be performed next is processed as a "specific inspection region" in the subsequent processes. The specific region includes a pattern region used for the exposure process immediately after the inspection. In the first embodiment, the inspection apparatus 3 inspects the specific inspection region first (i.e., prior to other inspection regions).

In step S103, the controller 4 controls the inspection apparatus 3 to inspect the specific inspection region. More specifically, the controller 4 controls the conveyance robot 7 to convey the article 30 placed on the reticle holding unit 1 to the inspection apparatus 3. The controller 4 sends information indicating the specific inspection region to the inspection apparatus 3 so that it inspects the specific inspection region.

In step S104, the controller 4 determines whether an abnormality (e.g., a foreign particle or a pattern defect) is found, on the basis of the inspection result obtained by the inspection apparatus 3. If the controller 4 determines that no abnormality is found (the reticle 30 is acceptable), the process advances to step S105. If the controller 4 determines that an abnormality is found (the reticle 30 is defective), the process advances to step S108.

In step S105, the controller 4 issues an instruction to the conveyance robot 7 to convey the reticle 30 from the inspection apparatus 3 to the reticle stage 2 of the exposure unit 20. The controller 4 controls the exposure unit 20 to perform exposure using a pattern region included in the specific inspection region. With this operation, the exposure unit 20 illuminates the pattern region included in the specific inspection region by the illumination system 9, to project this pattern region to a substrate held by the substrate stage 8 via the projection optical system 6, thereby exposing the substrate to light. This exposure transfers a pattern formed in the pattern region to a photosensitive material applied on the substrate. This exposure is continuously performed on a substrate in one lot, while exchanging them.

In step S106, the controller 4 issues an instruction to the conveyance robot 7, to convey the reticle 30 from the reticle stage 2 of the exposure unit 20 to the inspection apparatus 3. The controller 4 controls the inspection apparatus 3 to inspect some or all of the other inspection regions of the plurality of inspection regions of the reticle 30. The inspection target region may include the specific inspection region.

In step S107, the controller 4 outputs the inspection result obtained by the inspection apparatus 3 in step S106 to the console 5 or an external apparatus (not shown).

In step S108, the controller 4 outputs a message representing that an abnormality is found in the inspection of the specific inspection region to the console 5 or external apparatus (not shown).

As described above, according to this embodiment, the inspection apparatus 3 inspects only a specific inspection region of a plurality of inspection regions before an exposure process (step S105) given the first priority. Therefore, an inspection region, including a pattern region used for an exposure process given the first priority, is inspected before the exposure process given the first priority, while other inspection regions are inspected after the exposure process given the first priority. Even when abnormalities are present in inspection regions other than a specific inspection region, they never inhibit the execution of exposure using a pattern region included in the specific inspection region. In addition, inspecting the other inspection regions after the exposure process makes it possible to inspect them in advance, before pattern regions included in them become necessary in the next or subsequent exposure process. This makes it possible to quickly start exposure using the other pattern regions.

In the above-described embodiment, if it is determined in step S104 that an abnormality is found in the specific inspection region, the process may advance, not to step S108, but to step S106.

The inspection apparatus 3 comprises an inspection unit 3a serving as the main part, and a controller 3b for controlling the inspection unit 3a. The controller 3b may control the operation illustrated in FIG. 4. In this case, the controller 4 can function as an upper controller superior to the controller 3b.

Second Embodiment

The second embodiment of the present invention will be described below. Details (e.g., the arrangement of an exposure apparatus), which are not particularly referred to here can be the same as in the first embodiment.

Figure 5:
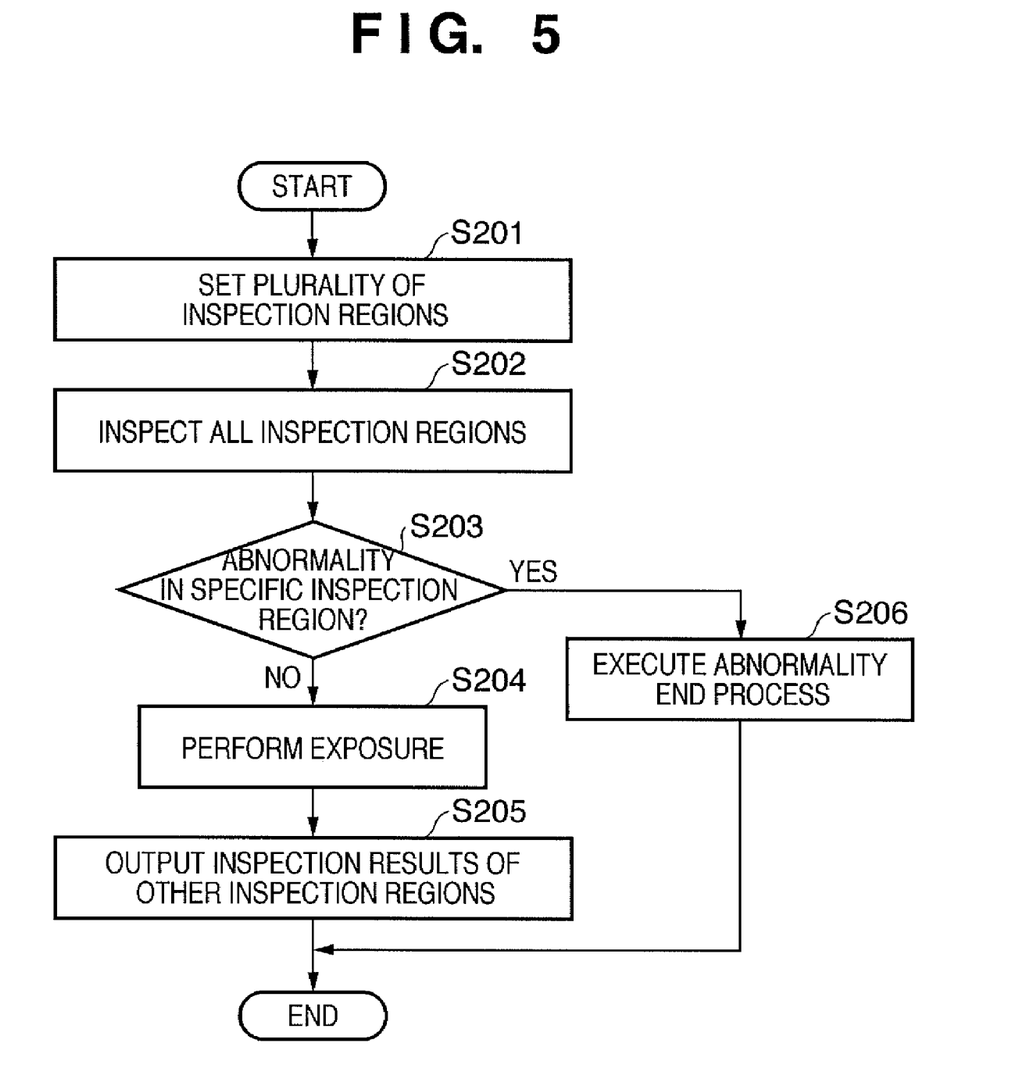
FIG. 5 is a flowchart illustrating the operation of the exposure apparatus shown in FIG. 1, according to the second embodiment.

FIG. 5 is a flowchart illustrating the operation of the exposure apparatus shown in FIG. 1. A controller 4, for example, can control the operation specified by the flowchart illustrated in FIG. 5.

In step S201, the controller 4 sets a plurality of inspection regions for a reticle 30. Each inspection region is set such that it includes at least one pattern region. The plurality of inspection regions can be set in accordance with, e.g., an instruction issued from the user via a console 5 or an instruction issued from an external apparatus (not shown) via a network or communication line. Note that one inspection region is set as a specific inspection region differently from other inspection regions.

In step S202, the controller 4 controls an inspection apparatus 3 to inspect all the inspection regions. More specifically, the controller 4 controls a conveyance robot 7 to convey the reticle 30 placed on a reticle holding unit 1 to the inspection apparatus 3. The controller 4 sends information indicating the specific inspection region to the inspection apparatus 3, so that it inspects all the inspection regions, including the specific inspection region.

In step S203, the controller 4 determines whether an abnormality (e.g., a foreign particle or pattern defect) is found, on the basis of the inspection result obtained by the inspection apparatus 3. If the controller 4 determines that no abnormality is found, the process advances to step S204. If the controller 4 determines that an abnormality is found, the process advances to step S206.

In step S204, the controller 4 issues an instruction to the conveyance robot 7 to convey the reticle 30 from the inspection apparatus 3 to a reticle stage 2 of an exposure unit 20. The controller 4 controls the exposure unit 20 to perform exposure using a pattern region included in the specific inspection region. With this operation, the exposure unit 20 illuminates the pattern region included in the specific inspection region by an illumination system 9, to project this pattern region to a substrate held by a substrate stage 8 via a projection optical system 6, thereby exposing the substrate to light. This exposure transfers a pattern formed in the pattern region to a photosensitive material applied on the substrate. This exposure is continuously performed on substrates in one lot while exchanging them.

In step S205, the controller 4 outputs the inspection results of the other inspection regions obtained by the inspection apparatus 3 in step S202 to the console 5 or external apparatus (not shown).

In step S206, the controller 4 outputs a message representing that an abnormality is found in the inspection of the specific inspection region to the console 5 or external apparatus (not shown).

According to the above-described embodiment, even when an abnormality is found in the inspection in step S202, or the reticle has an abnormality, if the abnormality falls outside a specific inspection region, an exposure process is immediately performed using a pattern region included in the specific inspection region. This improves the throughput when an abnormality is present in regions other than a specific inspection region.

The inspection apparatus 3 comprises an inspection unit 3*a* serving as the main part, and a controller 3*b* for controlling the inspection unit 3*a*. The controller 3*b* may control the operation illustrated in FIG. 4. In this case, the control unit 4 can function as an upper controller, superior to the controller 3*b*.

Third Embodiment

The third embodiment of the present invention will be described below. This embodiment changes the first and second embodiments so as to set the inspection condition of at least a specific inspection region of a plurality of inspection regions.

Figure 6:
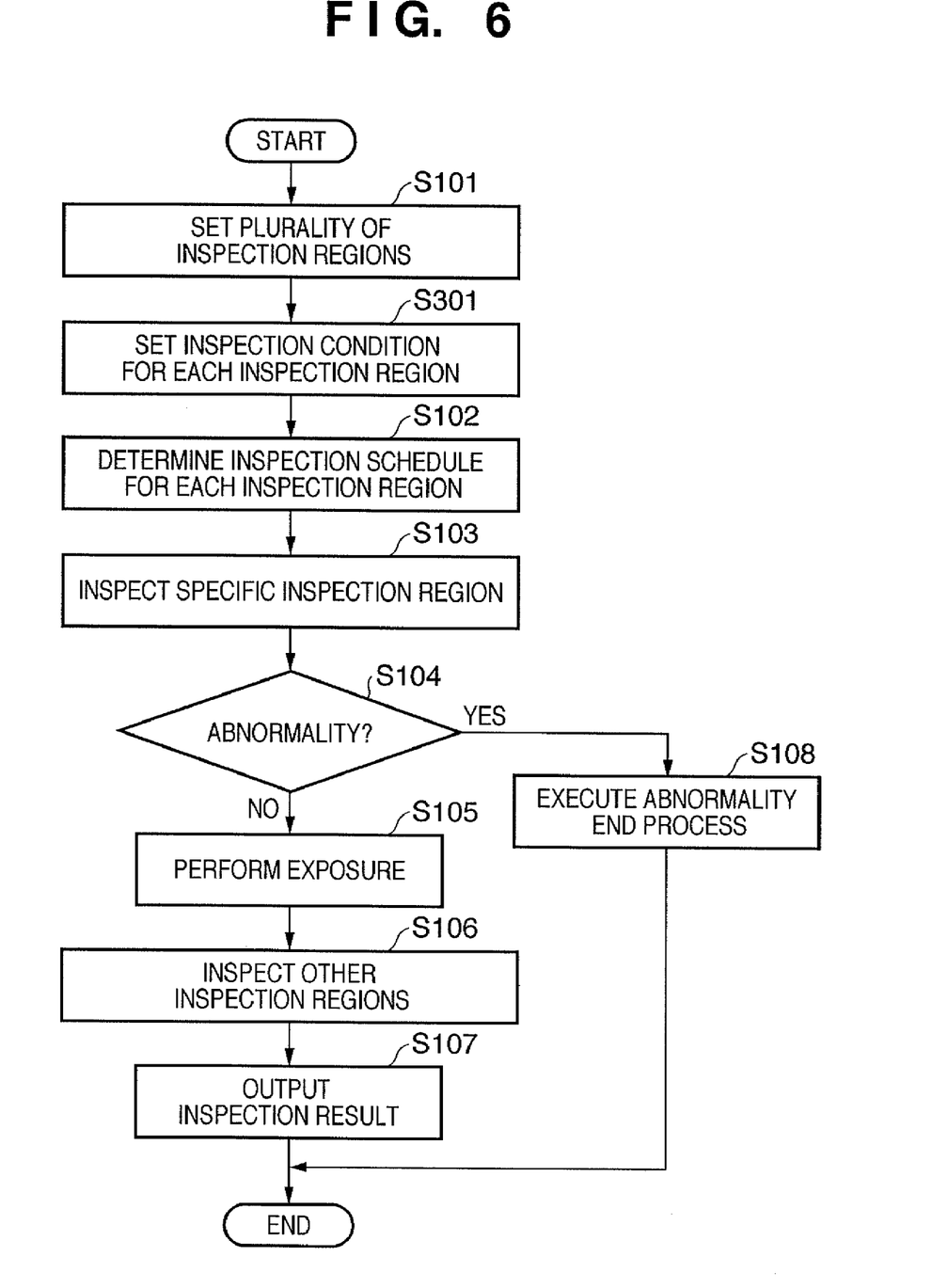
FIG. 6 is a flowchart illustrating the operation of the exposure apparatus shown in FIG. 1, according to the third embodiment.
Figure 7:
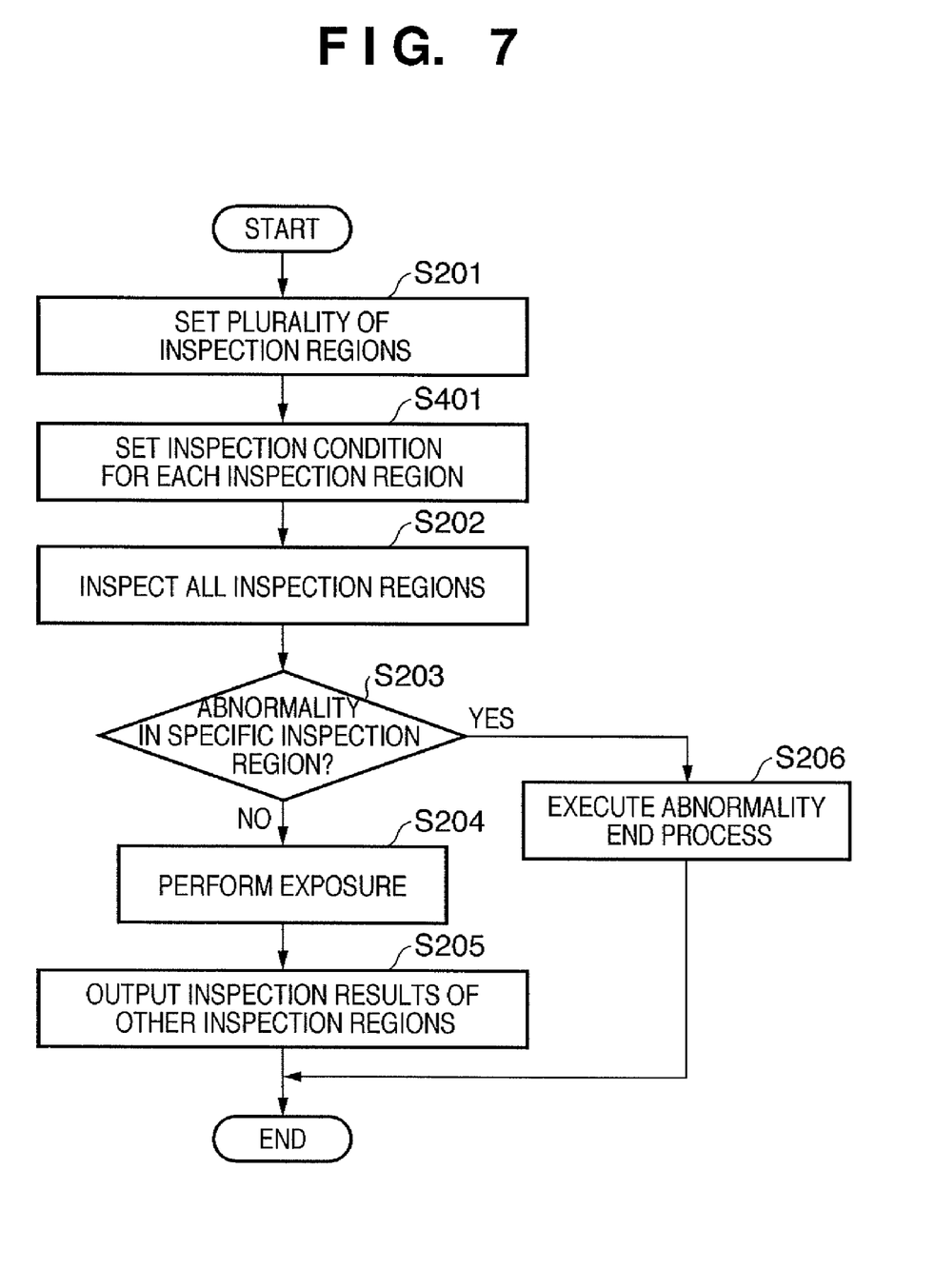
FIG. 7 is a flowchart illustrating the operation of the exposure apparatus shown in FIG. 1, according to the third embodiment.

FIG. 6 is a flowchart illustrating a modification to the first embodiment. In this modification, step S301 is added before step S103, e.g., between steps S101 and S102. In step S301, a controller 4 sets the inspection condition of at least a specific inspection region of a plurality of inspection regions and, preferably, the inspection conditions of all the inspection regions.

The inspection condition can be defined as, e.g., a condition associated with the allowable size of a foreign particle and/or a condition associated with the inspection speed. The controller 4 can determined the inspection condition on the basis of the features (e.g., the density and minimum line width) of a pattern formed in a pattern region. Information associated with the pattern can be provided from, e.g., an external apparatus (not shown) via a network or a communication line.

Figure 8:
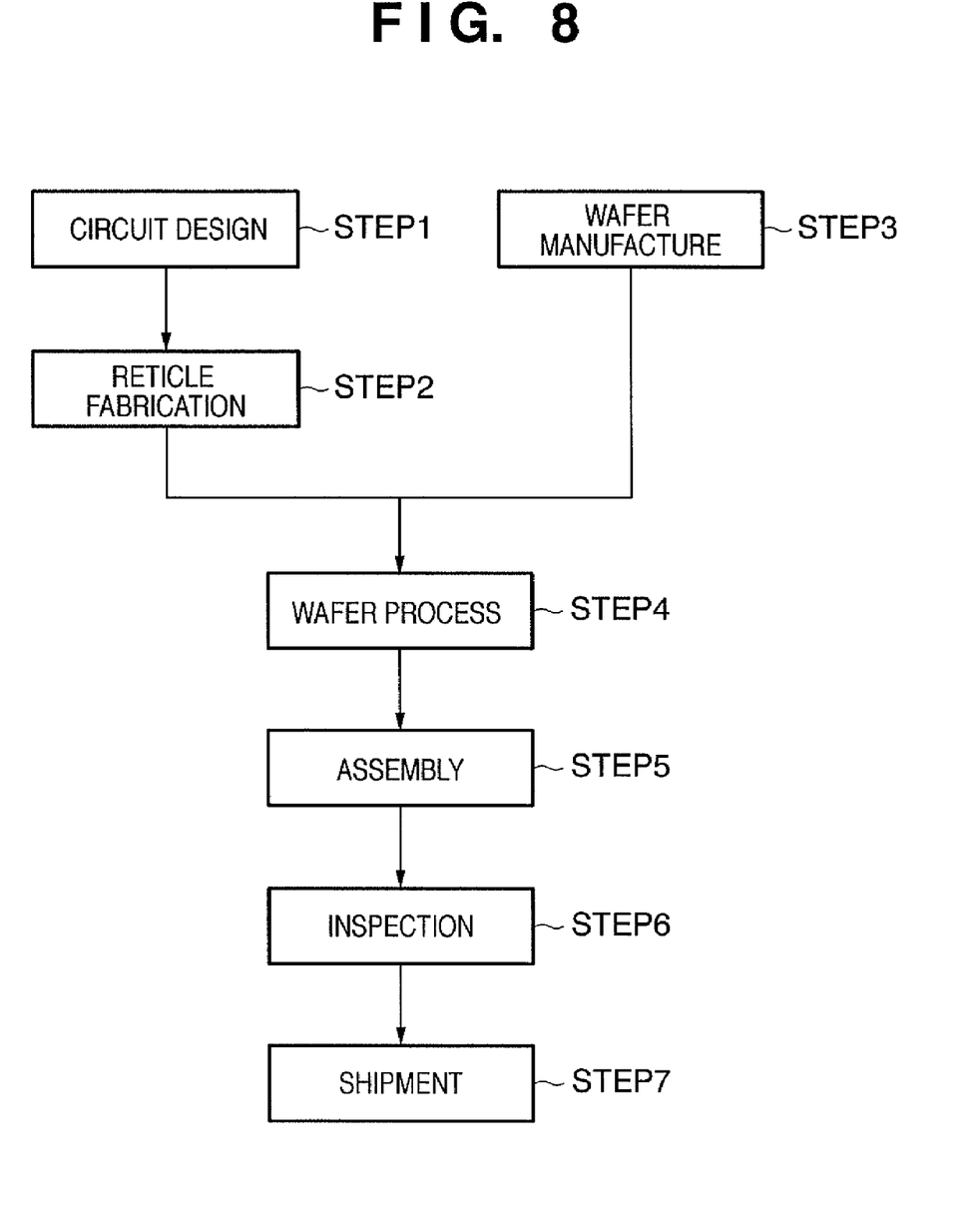
FIG. 8 is a flowchart for explaining a method of manufacturing a device.

A method of manufacturing a device using the above-described exposure apparatus will be explained next. FIG. 8 is a flowchart illustrating the overall sequence of a process of manufacturing a semiconductor device. In step 1 (circuit design), the circuit of a semiconductor device is designed. In step 2 (reticle fabrication), a reticle (also called an original or a mask) is fabricated on the basis of the designed circuit pattern. In step 3 (wafer manufacture), a wafer (also called a substrate) is manufactured using a material such as silicon. In step 4 (wafer process), called a preprocess, an actual circuit is formed on the wafer by lithography using the reticle and wafer. In step 5 (assembly), called a post-process, a semiconductor chip is formed using the wafer manufactured in step 4. This step includes processes, such as assembly (dicing and bonding) and packaging (chip encapsulation). In step 6 (inspection), inspections, including an operation check test and a durability test of the semiconductor device manufactured in step 5, are performed. A semiconductor device is completed with these processes and shipped in step 7.

Figure 9:
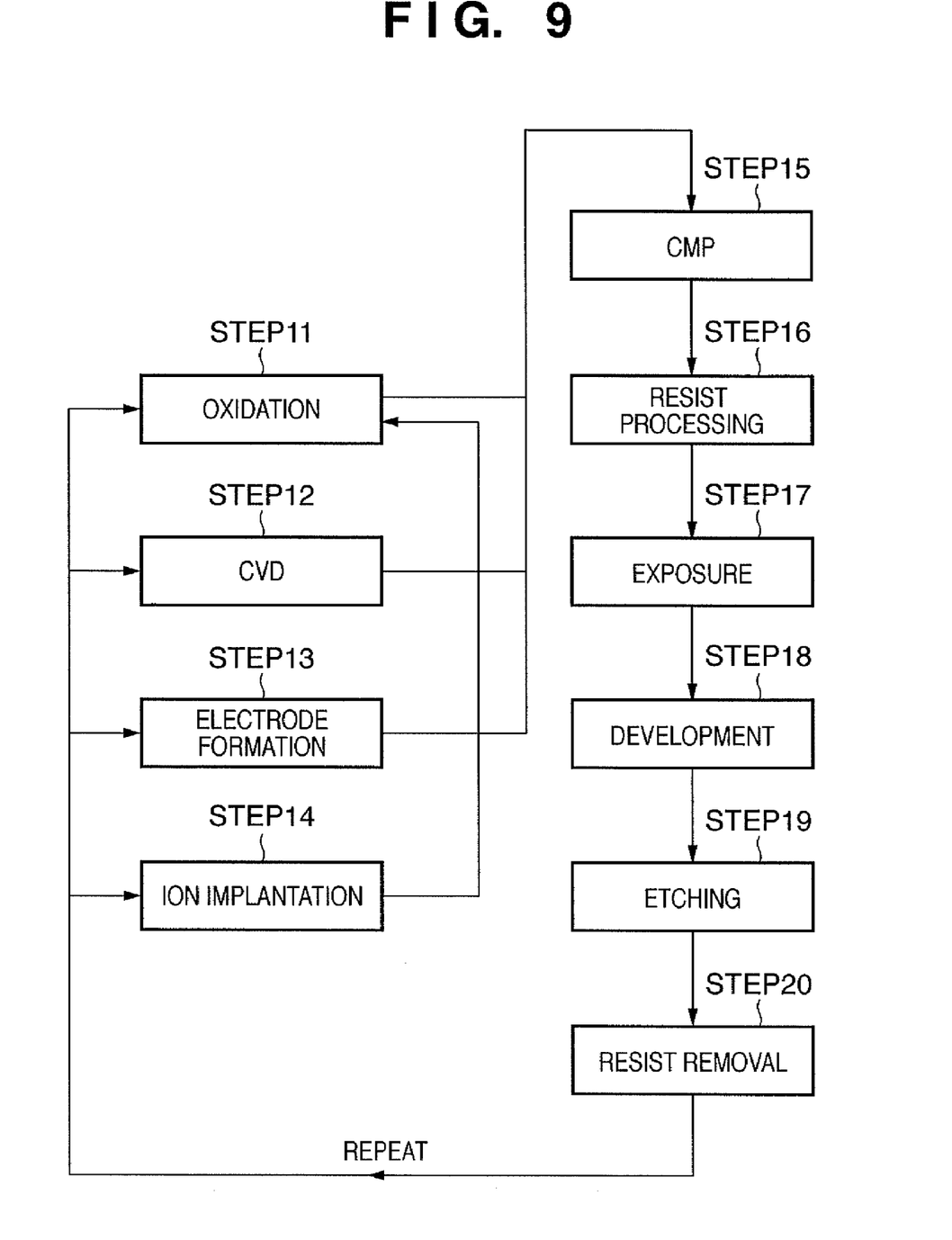
FIG. 9 is a flowchart for explaining the method of manufacturing the device.

FIG. 9 is a flowchart illustrating the detailed sequence of the wafer process. In step 11 (oxidation), the wafer surface is oxidized. In step 12 (CVD), an insulating film is formed on the wafer surface. In step 13 (electrode formation), an electrode is formed on the wafer by vapor deposition. In step 14 (ion implantation), ions are implanted into the wafer. In step 15 (CMP), the insulating film is planarized by CMP. In step 16 (resist processing), a photosensitive material is applied on the wafer. In step 17 (exposure), the above-described exposure apparatus is used to form a latent image pattern on the resist by exposing the wafer coated with the photosensitive material to light via the mask on which the circuit pattern is formed. In step 18 (development), the latent image pattern formed on the resist on the wafer is developed to form a resist pattern. In step 19 (etching), the layer or substrate under the resist pattern is etched through an opening of the resist pattern. In step 20 (resist removal), any unnecessary resist remaining after etching is removed. By repeating these steps, a multilayered structure of circuit patterns is formed on the wafer.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. An exposure apparatus for transferring a pattern to a substrate by exposing the substrate to light via a reticle, the apparatus comprising:
   (a) an inspection unit configured to inspect the reticle;
   (b) an exposure unit configured to expose the substrate to light via the reticle inspected by the inspection unit; and
   (c) a controller configured to control the inspection unit and the exposure unit,
   wherein the controller is configured:
   (i) to set a partial region of the reticle,
   (ii) to cause the inspection unit to inspect the partial region of the reticle and a region of the reticle that is different from the partial region, and
   (iii) to cause the exposure unit to expose the substrate to light via the partial region, irrespective of a presence and an absence of an abnormality in the region that is different from the partial region, if the inspection unit finds no abnormality in the partial region.

2. An apparatus according to claim 1, wherein the controller is configured to set a region including a specific pattern region of a plurality of separated pattern regions as the partial region, and to cause the exposure unit to expose the substrate to light via the specific pattern region if the inspection unit finds no abnormality in the partial region.

3. An apparatus according to claim 1, wherein the controller is configured to set a condition for at least the partial region of the reticle, and the inspection unit is configured to execute the inspection in accordance with the condition set by the controller.

4. An apparatus according to claim 3, wherein the controller is configured to set the condition based on a feature of a pattern formed on the reticle.

5. A method of manufacturing a device, said method comprising:
   exposing a substrate to light using an exposure apparatus defined in claim 1;
   developing the exposed substrate; and
   processing the developed substrate to manufacture the device.

6. An exposure apparatus for transferring a pattern to a substrate by exposing the substrate to light via a reticle, the apparatus comprising:
   (a) an inspection unit configured to inspect the reticle;
   (b) an exposure unit configured to expose the substrate to light via the reticle inspected by the inspection unit; and
   (c) a controller configured to control the inspection unit and the exposure unit,
   wherein the controller is configured:
   (i) to set, for the reticle having a plurality of pattern regions to be selectively used for exposing the substrate to light via the reticle, a partial region including one specific pattern region of the plurality of pattern regions,
   (ii) to cause the inspection unit to inspect the partial region of the reticle and a region of the reticle that is different from the partial region, and (iii) to cause the exposure unit to expose the substrate to light via the specific pattern region, irrespective of a presence and an abnormality in the region that is different from the specific region and that has been inspected by the inspection unit, if the inspection unit finds no abnormality in the specific pattern region.

7. An apparatus according to claim 6, wherein the plurality of pattern regions respectively correspond to a plurality of layers of a device to be manufactured via exposures of the substrate to light via the reticle.

8. A method of manufacturing a device, said method comprising:
    exposing a substrate to light using an exposure apparatus defined in claim 6;
    developing the exposed substrate; and
    processing the developed substrate to manufacture the device.

9. An exposure apparatus for transferring a pattern to a substrate by exposing the substrate to light via a reticle, the apparatus comprising:
    (a) an inspection unit configured to inspect the reticle;
    (b) an exposure unit configured to expose the substrate to light via the reticle inspected by the inspection unit; and
    (c) a controller configured to control the inspection unit and the exposure unit,
    wherein the controller is configured:
        (i) to set a first partial region and a second partial region of the reticle,
        (ii) to cause the inspection unit to inspect only the first partial region of the reticle,
        (iii) to cause the exposure unit to perform the exposure of the substrate to light via the first partial region if the inspection unit finds no abnormality in the first partial region,
        (iv) to cause the inspection unit to inspect the second partial region of the reticle after the exposure, and
        (v) to output information concerning the inspection of the second partial region of the reticle if the inspection unit finds an abnormality in the second partial region.

10. An exposure apparatus for transferring a pattern to a substrate by exposing the substrate to light via a reticle, the apparatus comprising:
    (a) an inspection unit configured to inspect the reticle;
    (b) an exposure unit configured to expose the substrate to light via the reticle inspected by the inspection unit; and
    (c) a controller configured to control the inspection unit and the exposure unit,
    wherein the controller is configured:
        (i) to set, for the reticle having a plurality of pattern regions to be selectively used for exposing the substrate to light via the reticle, a first pattern region and a second pattern region of the plurality of pattern regions,
        (ii) to cause the inspection unit to inspect only the first pattern region of the reticle,
        (iii) to cause the exposure unit to perform an exposure of the substrate to light via the first pattern region if the inspection unit finds no abnormality in the first pattern region,
        (iv) to cause the inspection unit to inspect the second partial region of the reticle after the exposure, and
        (v) to output information concerning the inspection of the second partial region of the reticle if the inspection unit finds an abnormality in the second pattern region.

11. An exposure apparatus for transferring a pattern to a substrate by exposing the substrate to light via a reticle, the apparatus comprising:
    (a) an inspection unit configured to inspect the reticle;
    (b) an exposure unit configured to expose the substrate to light via the reticle inspected by the inspection unit; and
    (c) a controller configured to control the inspection unit and the exposure unit,
    wherein the controller is configured:
        (i) to set a first partial region and a second partial region of the reticle,
        (ii) to cause the inspection unit to inspect the first partial region and the second partial region of the reticle,
        (iii) to cause the exposure unit to expose the substrate to light via the first partial region, irrespective of a presence and an absence of an abnormality in the second partial region, if the inspection unit finds no abnormality in the first partial region, and
        (iv) to output information concerning the inspection of the second partial region of the reticle if the inspection unit finds an abnormality in the second partial region.

12. An exposure apparatus for transferring a pattern to a substrate by exposing the substrate to light via a reticle, the apparatus comprising:
    (a) an inspection unit configured to inspect the reticle;
    (b) an exposure unit configured to expose the substrate to light via the reticle inspected by the inspection unit; and
    (c) a controller configured to control the inspection unit and the exposure unit,
    wherein the controller is configured:
        (i) to set, for the reticle having a plurality of pattern regions to be selectively used for exposing the substrate to light via the reticle, a first pattern region and a second pattern region of the plurality of pattern regions,
        (ii) to cause the inspection unit to inspect the first pattern region and the second pattern region of the reticle,
        (iii) to cause the exposure unit to expose the substrate to light via the first pattern region, irrespective of a presence and an absence of an abnormality in the second pattern region, if the inspection unit finds no abnormality in the first pattern region, and
        (iv) to output information concerning the inspection of the second partial region of the reticle if the inspection unit finds an abnormality in the second partial region.

* * * * *